United States Patent
Zhang et al.

(10) Patent No.: US 10,243,004 B2
(45) Date of Patent: Mar. 26, 2019

(54) LOW-TEMPERATURE POLYCRYSTALLINE SILICON THIN FILM TRANSISTOR, AND MANUFACTURING METHOD FOR FABRICATING THE SAME, ARRAY SUBSTRATE, DISPLAY PANEL AND DISPLAY DEVICE

(71) Applicant: BOE TECHNOLOGY GROUP CO., LTD., Beijing (CN)

(72) Inventors: Shuai Zhang, Beijing (CN); Yucheng Chan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/540,112

(22) PCT Filed: Nov. 1, 2016

(86) PCT No.: PCT/CN2016/104224
§ 371 (c)(1),
(2) Date: Jun. 27, 2017

(87) PCT Pub. No.: WO2017/076274
PCT Pub. Date: May 11, 2017

(65) Prior Publication Data
US 2017/0365623 A1    Dec. 21, 2017

(30) Foreign Application Priority Data

Nov. 5, 2015  (CN) .......................... 2015 1 0743470

(51) Int. Cl.
*H01L 29/786*    (2006.01)
*H01L 27/12*    (2006.01)
(Continued)

(52) U.S. Cl.
CPC .... *H01L 27/1222* (2013.01); *H01L 21/02112* (2013.01); *H01L 21/02282* (2013.01);
(Continued)

(58) Field of Classification Search
CPC ............. H01L 27/1222; H01L 27/1262; H01L 29/42384; H01L 29/513; H01L 29/6675;
(Continued)

(56) References Cited

U.S. PATENT DOCUMENTS 9,099,561 B2 * 8/2015 Kim .................. H01L 29/78633
9,941,312 B2 * 4/2018 Li .......................... H01L 21/84
(Continued)

FOREIGN PATENT DOCUMENTS

CN     102655146 A    9/2012
CN     103325836 A    9/2013
(Continued)

OTHER PUBLICATIONS

Search Report for International Patent Application No. PCT/CN2016/104224 dated Feb. 3, 2017.
(Continued)

*Primary Examiner* — Allan R Wilson
(74) *Attorney, Agent, or Firm* — Calfee, Halter & Griswold LLP (57) ABSTRACT

Disclosed are a low-temperature polycrystalline silicon thin film transistor (LTPS TFT), a method for fabricating the same, an array substrate, a display panel, and a display device. The LTPS TFT includes an active layer, a source, a drain, a gate, and a gate insulating layer which are arranged on a substrate. The gate insulating layer is arranged between the active layer and the gate, and a graphene oxide layer which is arranged between the active layer and the gate insulating layer. Since the graphene oxide layer is arranged between the active layer and the gate insulating layer, the
(Continued)

interface between the active layer and the gate insulating layer of polycrystalline (P-Si) has a reduced roughness and interfacial defect density, and a pre-cleaning process is not necessary for the gate insulating layer.

14 Claims, 5 Drawing Sheets

(51) Int. Cl.
  *H01L 21/02* (2006.01)
  *H01L 29/423* (2006.01)
  *H01L 29/51* (2006.01)
  *H01L 29/66* (2006.01)
  *H01L 29/49* (2006.01)

(52) U.S. Cl.
  CPC .... *H01L 21/02318* (2013.01); *H01L 27/1262* (2013.01); *H01L 29/42384* (2013.01); *H01L 29/4908* (2013.01); *H01L 29/513* (2013.01); *H01L 29/6675* (2013.01); *H01L 29/66757* (2013.01); *H01L 29/66765* (2013.01); *H01L 29/78603* (2013.01); *H01L 29/78675* (2013.01); *H01L 29/78678* (2013.01); *H01L 27/1218* (2013.01); *H01L 27/1248* (2013.01)

(58) Field of Classification Search
  CPC ......... H01L 29/78603; H01L 29/78675; H01L 29/78678
  See application file for complete search history.

(56) References Cited

U.S. PATENT DOCUMENTS

| | | | | |
|---|---|---|---|---|
| 2008/0012023 | A1* | 1/2008 | Matsumura | H01L 27/12 257/72 |
| 2011/0291068 | A1* | 12/2011 | Kobayashi | H01L 29/66742 257/9 |
| 2012/0132855 | A1* | 5/2012 | Ishitani | C09K 19/0275 252/299.63 |
| 2013/0043475 | A1 | 2/2013 | Kim et al. | |
| 2014/0070220 | A1 | 3/2014 | Zhang et al. | |
| 2014/0284718 | A1 | 9/2014 | Lim et al. | |
| 2014/0299838 | A1 | 10/2014 | Lee et al. | |
| 2014/0299841 | A1 | 10/2014 | Nourbakhsh et al. | |
| 2016/0027931 | A1 | 1/2016 | Zhang et al. | |
| 2017/0194151 | A1* | 7/2017 | Zhang | H01L 21/26513 |

FOREIGN PATENT DOCUMENTS

| | | |
|---|---|---|
| CN | 103531639 A | 1/2014 |
| CN | 105261654 A | 1/2016 |
| CN | 205092247 U | 3/2016 |

OTHER PUBLICATIONS

First Office Action for Chinese Patent Application No. 201510743470.1 dated Sep. 5, 2017.
Second Office Action for Chinese Patent Application No. 201510743470.1 dated Apr. 23, 2018.

* cited by examiner

LOW-TEMPERATURE POLYCRYSTALLINE SILICON THIN FILM TRANSISTOR, AND MANUFACTURING METHOD FOR FABRICATING THE SAME, ARRAY SUBSTRATE, DISPLAY PANEL AND DISPLAY DEVICE

RELATED APPLICATIONS

The present application is the U.S. national phase entry of PCT/CN2016/104224, with an international filing date of Nov. 1, 2016, which claims the benefit of Chinese Patent Application 201510743470.1, filed on Nov. 5, 2015, the entire disclosures of which are incorporated herein by reference.

TECHNICAL FIELD

The present disclosure relates to the field of display technology, and particularly to a low temperature polysilicon (LTPS) thin film transistor (TFT), a method for fabricating the same, an array substrate, a display panel, and a display device.

BACKGROUND

An LTPS TFT liquid crystal display (LCD) is different from a conventional amorphous (a-Si) TFT-LCD. The conventional amorphous material only has an electron mobility of 0.5 $cm^2$/V·sec, while LTPS has an electron mobility up to 50-200 $cm^2$/V·sec. Therefore, as compared with the conventional a-Si TFT-LCD, the LTPS TFT-LCD has advantages like improvements in term of resolution, response time, aperture ratio, and brightness. Furthermore, an increased electron mobility enables the peripheral driving circuit to be integrated onto a glass substrate, which realizes an integrated system on glass (SOG) and saves space and cost.

In the existing LTPS process, an interface between a polysilicon (P-Si) active layer and a gate insulating layer (GI) is generally subject to a gate insulating layer pre-cleaning (Pre-GI Clean) process. Namely, prior to forming the gate insulating layer, the surface of P-Si active layer is subject to pre-cleaning. This pre-cleaning process can only improve the roughness of the interface between the active layer and the gate insulating layer and reduce interfacial state defect density to an extent. Further, products of different specification may need different pre-cleaning processes, which increases the process complexity and time cost.

Therefore, there is a need for an improved LTPS TFT and a method for fabricating the same.

SUMMARY

It is an object of embodiments the present disclosure to alleviate or eliminate one or more of the above problems. In a first aspect, an embodiment provides an LTPS TFT, comprising an active layer, a source, a drain, a gate, and a gate insulating layer on a substrate, wherein the gate insulating layer is arranged between the active layer and the gate, and wherein the LTPS TFT further comprises a graphene oxide layer which is arranged between the active layer and the gate insulating layer.

According to the present embodiment, a graphene oxide layer is added between the P-Si active layer and the gate insulating layer. In graphene oxide, a planar layer structure is formed in which sp2 hybrid orbitals of carbon atoms are combined to in hexagonal and honeycomb lattices. Graphene oxide has a relatively high ion mobility and has a conjugated π-bond electron cloud distribution. As compared with P-Si, graphene oxide has a smaller molecular structure, so that the roughness and interfacial defect density of the interface between the P-Si active layer and the gate insulating layer are further reduced, so as to increase the characteristics of LTPS TFT. Due to the application of a graphene oxide layer, the gate insulating layer pre-cleaning process is not required during the process for fabricating the LTPS TFT, and this simplifies the fabricating process and reduces cost.

In an exemplary embodiment, the active layer is arranged on the substrate, the graphene oxide layer is arranged on the active layer, and the gate insulating layer covers a stack of the active layer and the graphene oxide layer.

In an exemplary embodiment, the gate is arranged on the substrate, the gate insulating layer covers the gate, the graphene oxide layer is arranged on the gate insulating layer, and the active layer is arranged on the graphene oxide layer In an exemplary embodiment, the graphene oxide layer has a thickness about 10-20 nm.

According to the present embodiment, graphene oxide layer has a thickness about 10-20 nm, so as to provide an even surface. As an example, the graphene oxide layer has a thickness about 10 nm.

In an exemplary embodiment, the LTPS TFT further comprises a buffer layer which is formed on the substrate.

According to the present embodiment, the buffer layer is arranged between the substrate and the active layer (for a top gate TFT), or between the substrate and the gate (for a bottom gate TFT), so that the adhesion strength between the active layer or gate to be formed and the substrate is increased. The buffer layer isolates the substrate from the active layer, and prevents impurities in the substrate from entering the active layer which would affect the performance of TFT. Besides, when a-Si is converted to P-Si by annealing with excimer laser to form the active layer, the buffer layer further decrease heat dissipation between P-Si and the substrate, and the effect of temperature rise on the substrate during annealing is reduced.

In an exemplary embodiment, the buffer layer is made from silicon oxide, silicon nitride, or silicon oxynitride. The buffer layer has a thickness about 50-300 nm. As an example, the buffer layer is made from silicon oxide and has a thickness about 50-100 nm. Alternatively, the buffer layer is made from silicon nitride and has a thickness about 100-300 nm.

According to the present embodiment, the buffer layer which is formed on the substrate with the above thickness, not only efficiently isolate impurities from the substrate, but also provides protection for the substrate during laser annealing.

In an exemplary embodiment, the active layer is arranged on the buffer layer; the LTPS TFT further comprises an interlayer dielectric layer (ILD) which is arranged on the gate; and the source and the drain are connected to the active layer through vias which run through the graphene oxide layer, the gate insulating layer and the interlayer dielectric layer, respectively.

According to the present embodiment, the LTPS TFT is a top gate type. Namely, the LTPS TFT comprises a substrate, a stack of an active layer and a graphene oxide layer which is formed on the substrate, a gate insulating layer which covers the substrate and the stack, a gate which is formed on the gate insulating layer and arranged over the stack, an interlayer dielectric layer which covers the gate and the gate insulating layer, and a source and a drain which are formed on the interlayer dielectric layer and electrically connected to the active layer. In the top gate type TFT, the active layer is directly formed the substrate (or the buffer layer), the surface of substrate is very even, so that the surface of the active layer formed on the substrate (or the buffer layer) is also relatively even. This reduces the roughness of the interface between the active layer and the gate insulating layer, and increases the performance of LTPS TFT.

In an exemplary embodiment, the gate is arranged on the buffer layer; the LTPS TFT further comprises an interlayer dielectric layer which is arranged on the active layer; and the source and the drain are connected to the active layer through vias which run through the interlayer dielectric layer, respectively.

According to the present embodiment, the LTPS TFT is a bottom gate type. Namely, the LTPS TFT comprises a substrate, a gate which is formed on the substrate, a gate insulating layer which covers the substrate and the gate, a stack of a graphene oxide layer and an active layer which is formed on the gate insulating layer, an interlayer dielectric layer which covers the gate insulating layer and the stack, and a source and a drain which are formed on the interlayer dielectric layer and electrically connected to the active layer. In the bottom gate type TFT, the gate and the gate insulating layer act as an optical protection layer for the active layer, and prevent the light from a back light source from irradiating on the photon-generated carriers from the active layer, which otherwise would impair the electrical characteristics of the active layer and thus affect the performance of TFT.

In an exemplary embodiment, the active layer comprises a source contact area and a drain contact area which are doped; the source is arranged on the source contact area and connected to the source contact area; and the drain is arranged on the drain contact area and connected to the drain contact area.

According to the present embodiment, portions of the active layer to which the source and the drain are to be connected are formed into the source contact area and the drain contact area, e.g., by doping. This realizes an ohmic contact between the source and drain and the active layer, so as to improve the performance of LTPS TFT.

In a second aspect, an embodiment provides an array substrate, which comprises the LTPS TFT as described above, a planarization layer covering the LTPS TFT, and a pixel electrode, wherein the pixel electrode is connected to the drain of the LTPS TFT through a via which runs through the planarization layer.

The array substrate according to the present disclosure has same or similar beneficial effects as the above LTPS TFT, which are not repeated here for simplicity.

In a third aspect, an embodiment provides a display panel, which comprises the array substrate as described above.

The display panel according to the present disclosure has same or similar beneficial effects as the above LTPS TFT, which are not repeated here for simplicity.

In a fourth aspect, an embodiment provides a display device, which comprises the display panel as described above.

The display device according to the present disclosure has same or similar beneficial effects as the above LTPS TFT, which are not repeated here for simplicity.

In a fifth aspect, an embodiment provides a method for fabricating an LTPS TFT, comprise forming on a substrate an active layer, a source, a drain, a gate, and a gate insulating layer which is arranged between the active layer and the gate, the method further comprises forming a graphene oxide layer between the active layer and the gate insulating layer.

According to the present embodiment, a graphene oxide layer is added between the P-Si active layer and the gate insulating layer. In graphene oxide, a planar layer structure is formed in which sp2 hybrid orbitals of carbon atoms are combined to in hexagonal and honeycomb lattices. Graphene oxide has a relatively high ion mobility and has a conjugated π-bond electron cloud distribution. As compared with P-Si, graphene oxide has a smaller molecular structure, so that the roughness and interfacial defect density of the interface between the P-Si active layer and the gate insulating layer are further reduced, so as to increase the characteristics of LTPS TFT. Due to the application of a graphene oxide layer, the gate insulating layer pre-cleaning process is not required during the process for fabricating the LTPS TFT, and this simplifies the fabricating process and reduces cost.

In an exemplary embodiment, forming the graphene oxide layer comprises: preparing a graphene oxide dispersion; spin coating the graphene oxide dispersion on the active layer or the gate insulating layer; and baking the graphene oxide dispersion to form the graphene oxide layer.

According to the present embodiment, the graphene oxide layer can be formed by spin coating and baking which is simple and cost effective.

In an exemplary embodiment, preparing the graphene oxide dispersion comprises: preparing graphene oxide by oxidizing graphite with an oxidizing agent; and disperse the graphene oxide in a solvent to prepare the graphene oxide dispersion.

According to the present embodiment, a precursor dispersion is prepared, so that the graphene oxide layer is formed by the spin coating process which is simple and cost effective.

In an exemplary embodiment, the oxidizing agent comprises concentrated sulfuric acid and potassium permanganate.

In an exemplary embodiment, the solvent is an ethanol aqueous solution with a volume percentage of 10%.

In an exemplary embodiment, the method further comprises: after baking the graphene oxide dispersion to form the graphene oxide layer, performing chemical mechanical polishing (CMP) on the graphene oxide layer.

According to the present embodiment, after spin coating and baking, the graphene oxide layer is subject to chemical mechanical polishing. This further increases surface evenness of the graphene oxide layer. This further improves the roughness of the interface between the active layer and the gate insulating layer and reduces interfacial state defect density.

Besides, the method for fabricating an LTPS TFT according to the present disclosure has same or similar beneficial effects as the above LTPS TFT, which are not repeated here for simplicity.

BRIEF DESCRIPTION OF THE DRAWINGS

In order to explain the technical solutions in embodiments of the present disclosure more clearly, the drawings to be used in the description of the embodiments will be introduced briefly in the following. Apparently, the drawings described below are only some embodiments of the present disclosure.

DETAILED DESCRIPTION OF EMBODIMENTS

Specific embodiments of the present disclosure will be further described hereinafter with reference to the drawings and embodiments. The following embodiments are only used for explaining more clearly the technical solution of the present disclosure rather than limiting the protection scope of the present disclosure.

Reference numerals: 100, 200 substrate; 102, 202 buffer layer; 104, 210 active layer; 104S source contact area; 104D drain contact area; 106, 208 graphene oxide layer; 108, 206 gate insulating layer; 110, 204 gate; 112, 212 interlayer dielectric layer; 114 via; 116 source/drain electrode layer; 118, 214 source electrode; 120, 216 drain electrode; 122, 218 planarization layer; 124, 220 pixel electrode; and 151, 152, 153, 154 photoresist layer.

Figure 1:
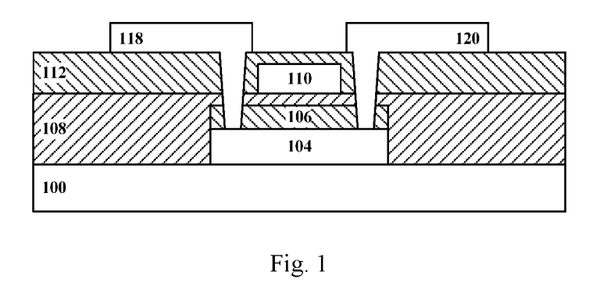
FIG. 1 is a structural diagram for illustrating an LTPS TFT in an embodiment of the present disclosure.

According to a first aspect of the present disclosure, it is provided an LTPS TFT. As shown in FIG. 1, the LTPS TFT comprises an active layer 104, a source 118, a drain 120, a gate 110, and a gate insulating layer 108 between the active layer 104 and the gate 110, which are arranged on a substrate 100. According to the present disclosure, the LTPS TFT further comprises a graphene oxide layer 106 which is arranged between the active layer 104 and the gate insulating layer 108.

In the LTPS TFT of the present disclosure, the graphene oxide layer is arranged between the P-Si active layer and the gate insulating layer, so as to solve the problem about the roughness and interfacial defect density of the interface between the P-Si active layer and the gate insulating layer. In graphene oxide, a planar layer structure is formed in which sp2 hybrid orbitals of carbon atoms are combined to in hexagonal and honeycomb lattices. Graphene oxide has a relatively high ion mobility and has a conjugated it-bond electron cloud distribution. As compared with P-Si, graphene oxide has a smaller molecular structure, so that the roughness and interfacial defect density of the interface between the P-Si active layer and the gate insulating layer are further reduced, so as to increase the characteristics of LTPS TFT. Due to the application of a graphene oxide layer, the gate insulating layer pre-cleaning process is not required during the process for fabricating the LTPS TFT, and this simplifies the fabricating process and reduces cost.

As an example, the graphene oxide layer has a thickness about 10-20 nm to provide an even surface. For example, the graphene oxide layer has a thickness of 10 nm.

Figure 2:
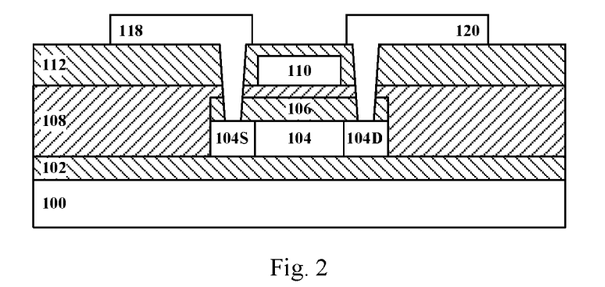
FIG. 2 is a structural diagram for illustrating an LTPS TFT in an embodiment of the present disclosure.

As an example, the LTPS TFT further comprises a buffer layer 102 which is formed on the substrate 100, as shown in FIG. 2. By arranging the buffer layer 102 on the substrate 100, the adhesion strength between the TFT to be formed and the substrate 100 is increased. In the embodiment shown in FIG. 2, the buffer layer 102 isolates the substrate 100 from the active layer 104 of TFT, and prevents impurities the substrate 100 from entering the active layer 104 which otherwise would affect the performance of TFT. Besides, when a-Si is converted to P-Si by annealing with excimer laser to form the active layer 104, the buffer layer 102 further decrease heat dissipation between the P-Si active layer 104 and the substrate 100, and the effect of temperature rise on the substrate 100 during annealing is reduced.

As an example, the buffer layer 102 is made from silicon oxide, silicon nitride, or silicon oxynitride. The buffer layer 102 has a thickness about 50-300 nm. For example, the buffer layer 102 is made from silicon oxide and has a thickness about 50-100 nm. Alternatively, the buffer layer 102 is made from silicon nitride and has a thickness about 100-300 nm. By forming the buffer layer on the substrate with the above thickness, it is possible to not only efficiently isolate impurities from the substrate, but also to protect the substrate during laser annealing.

As an example, the LTPS TFT is a top gate type TFT. For example, the active layer 104 is arranged on the buffer layer 102. The LTPS TFT further comprises an interlayer dielectric layer 112 which is arranged on the gate 110. The source 118 and the drain 120 are connected to the active layer 104, respectively, through vias which run through the graphene oxide layer 106, the gate insulating layer 108 and the interlayer dielectric layer 112. In particular, as shown in FIG. 1, the LTPS TFT comprises the substrate 100, a stack of the active layer 104 and the graphene oxide layer 106 which is formed on the substrate, the gate insulating layer 108 which covers the substrate 100 and the stack, the gate 110 which is formed on the gate insulating layer 108 and arranged over the stack, the interlayer dielectric layer 112 which covers the gate 110 and the gate insulating layer 108, and the source 118 and the drain 120 which are formed on the interlayer dielectric layer 112 and electrically connected to the active layer 104.

In the top gate type TFT, the active layer 104 is directly formed on the substrate 100. Since the substrate 100 has a very even surface, the active layer 104 which is formed on the substrate 100 also has a relatively even surface. This reduces the roughness of the interface between the active layer 104 and the gate insulating layer 108, and improves the performance of LTPS TFT.

Figure 3:
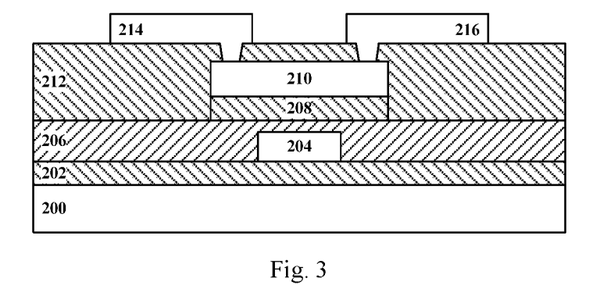
FIG. 3 is a structural diagram for illustrating an LTPS TFT in an embodiment of the present disclosure.

The concept of present disclosure is also applicable to a bottom gate type TFT. Namely, the LTPS TFT is a bottom gate type TFT. For example, as shown in FIG. 3, a gate 204 is arranged on a buffer layer 202. The LTPS TFT further comprises an interlayer dielectric layer 212 which is arranged on an active layer 210. A source 214 and a drain 216 are connected to the active layer 210, respectively, through vias which run through the interlayer dielectric layer 212. In particular, as shown in the figure, the LTPS TFT comprises a substrate 200, and the gate 204, a gate insulating layer 206 which covers the substrate 200 and the gate 204, a stack of a graphene oxide layer 208 and the active layer 210 which is formed on the gate insulating layer 206, the interlayer dielectric layer 212 which covers the gate insulating layer 206 and the stack, and the source 214 and the drain 216 which are formed on the interlayer dielectric layer 212 and electrically connected to the active layer 210.

In the bottom gate type TFT, the gate 204 and the gate insulating layer 206 act as an optical protection layer for the active layer 210, and prevent the light from a back light source from irradiating on the photon-generated carriers from the active layer 210, which otherwise would impair the electrical characteristics of the active layer 210 and thus affect the performance of TFT.

As an example, as shown in FIG. 2, the active layer 104 comprises the doped source contact area 104S and drain contact area 104D. The source 118 is arranged over the source contact area 104S and connected to the source contact area 104S. The drain 120 is arranged over the drain contact area 104D and connected to the drain contact area 104D. For example, portions of the active layer 104 to which the source 118 and the drain 120 are to be connected are formed into the source contact area 104S and the drain contact area 104D, e.g., by doping. This realizes an ohmic contact between the source 118 and drain 120 and the active layer 104, so as to improve the performance of LTPS TFT.

According to a second aspect of the present disclosure, it is provided an array substrate. The array substrate comprises the LTPS TFT as described above, a planarization layer which covers the LTPS TFT, and a pixel electrode, wherein the pixel electrode is connected to the drain of the LTPS TFT through a via which runs through the planarization layer.

Figure 4:
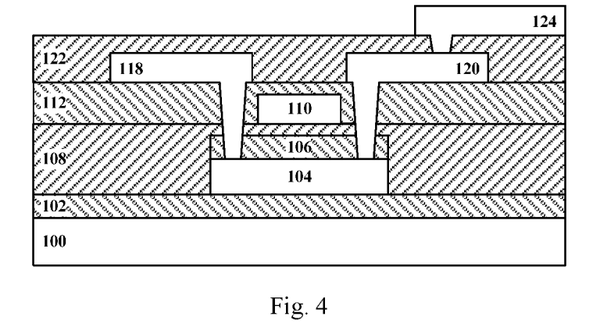
FIG. 4 is a structural diagram for illustrating an array substrate in an embodiment of the present disclosure.

As shown in FIG. 4, the array substrate comprises a planarization layer 122 which is arranged on the LTPS TFT and a pixel electrode 124 which is arranged on the planarization layer 122. The planarization layer 122 is generally made from resin or other insulating materials, and is provided with a via which exposes the drain 120 of the TFT. The pixel electrode 124 is connected with the drain 120 of the LTPS TFT through the via. In the array substrate shown in FIG. 4, the LTPS TFT is a top gate type, e.g. the LTPS TFT shown in FIG. 1 or 2.

Figure 5:
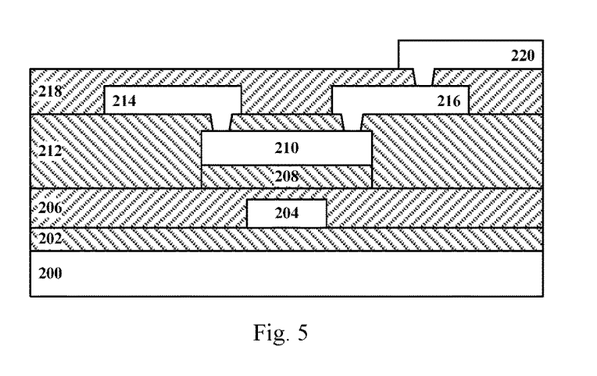
FIG. 5 is a structural diagram for illustrating an array substrate in an embodiment of the present disclosure.

FIG. 5 shows an array substrate to which a bottom gate type LTPS TFT is applied. The array substrate comprises a planarization layer 218 which is arranged on the LTPS TFT and a pixel electrode 220 which is arranged on the planarization layer 218. The planarization layer 218 is provided with a via which exposes the drain 216 of the TFT. The pixel electrode 220 is connected with the drain 216 of the LTPS TFT through the via. In the array substrate shown in FIG. 5, the LTPS TFT is the LTPS TFT shown in FIG. 3.

The array substrate according to the present disclosure has same or similar beneficial effects as the LTPS TFT as described above, which are not repeated here for simplicity.

According to a third aspect of the present disclosure, it is provided a display panel, which comprises the array substrate as described above.

The display panel is a display panel for an active matrix liquid crystal display (AMLCD) or an active matrix organic light emitting diode (AMOLED).

The display panel according to the present disclosure has same or similar beneficial effects as the LTPS TFT as described above, which are not repeated here for simplicity.

According to a fourth aspect of the present disclosure, it is provided a display device, which comprises the array substrate as described above. The display device is any product or component with a display function like a mobile phone, tablet computer, TV, monitor, notebook computer, digital photo frame, and navigator.

The display device according to the present disclosure has same or similar beneficial effects as the LTPS TFT as described above, which are not repeated here for simplicity.

Figure 6:
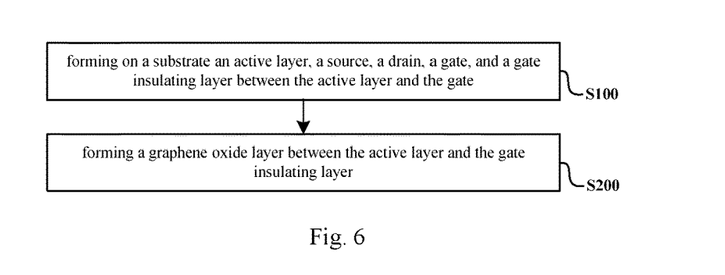
FIG. 6 is a flow chart for illustrating a method for fabricating an LTPS TFT in an embodiment of the present disclosure.

According to a fifth aspect of the present disclosure, it is provided a method for fabricating an LTPS TFT. As shown in FIG. 6, the method comprises: step S100, forming on a substrate an active layer, a source, a drain, a gate, and a gate insulating layer which is arranged between the active layer and the gate; and step S200, forming a graphene oxide layer between the active layer and the gate insulating layer. Due to graphene oxide has a smaller molecular structure than P-Si, the roughness and interfacial defect density of the interface between the P-Si active layer and the gate insulating layer is further reduced, and the characteristics of LTPS TFT is increased. Besides, the gate insulating layer pre-cleaning process is not required during the process for fabricating the LTPS TFT, and this simplifies the fabricating process and reduces cost.

As an example, forming the graphene oxide layer comprises: preparing a graphene oxide dispersion; spin coating the graphene oxide dispersion on the active layer or the gate insulating layer; and baking the graphene oxide dispersion to form the graphene oxide layer. Hereby, the graphene oxide layer is formed by spin coating and baking which are simple and cost effective.

As an example, preparing the graphene oxide dispersion comprises: preparing graphene oxide by oxidizing graphite with an oxidizing agent; and dispersing the graphene oxide in a solvent to prepare the graphene oxide dispersion. Hereby, the precursor dispersion is prepared, so that the graphene oxide layer is formed by spin coating which is simple and cost effective.

As an example, the oxidizing agent is a mixed solution of potassium permanganate and concentrated sulfuric acid. As an example, the solvent is an ethanol aqueous solution with a volume percentage of 10%.

As an example, the method further comprises: after baking the graphene oxide dispersion to form the graphene oxide layer, performing chemical mechanical polishing on the graphene oxide layer. Hereby, after spin coating and baking, the graphene oxide layer is subject to chemical mechanical polishing. This further increases the surface evenness of the graphene oxide layer. This further improves the roughness of the interface between the active layer and the gate insulating layer and reduces interfacial state defect density.

Figure 7A:
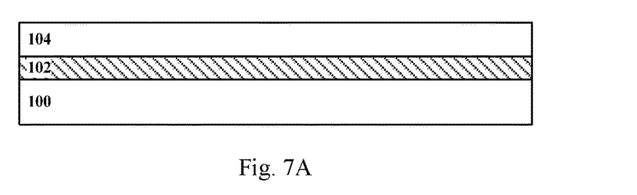
FIGS. 7A, 7B, 7C, 7D, 7E, 7F, 7G, 7H, 7I, 7J, 7K, 7L, 7M, 7N are structural diagrams for illustrating processing stages of an LTPS TFT in an embodiment of the present disclosure.
Figure 7B:
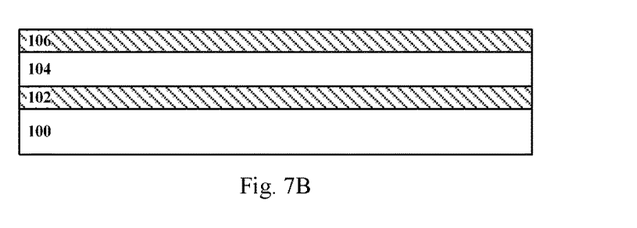
Figure 7C:
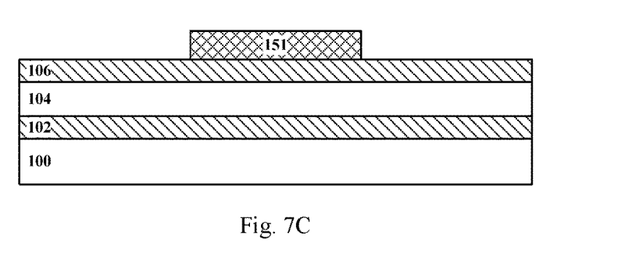
Figure 7D:
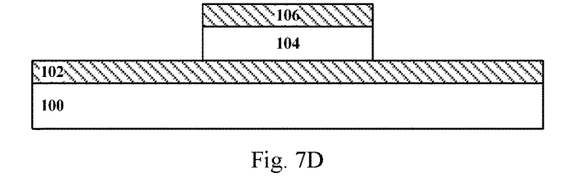
Figure 7E:
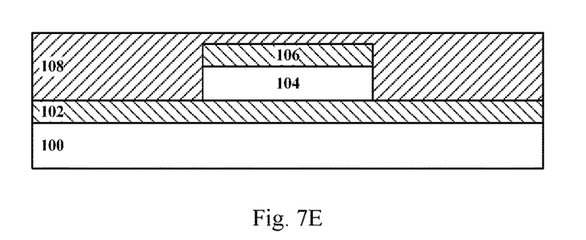

A method for fabricating an LTPS TFT according to the present disclosure will be described hereinafter with reference to FIGS. 7A-7N.

The substrate 100 is cleaned. The substrate 100 is made from a transparent material like glass. An active layer precursor, e.g., an a-Si film, is formed on the substrate 100 by a film forming process like plasma enhanced chemical vapor deposition (PECVD). The a-Si film has a thickness about 40-50 nm. Then, the substrate 100 is transferred to a furnace at an elevated temperature for dehydrogenation, i.e., reducing the content of hydrogen in the a-Si film. Generally, the content of hydrogen is controlled to a range not more than 2%. Then, the a-Si film on the substrate 100 is subject to an excimer laser annealing (ELA), so that the a-Si film is converted into a P-Si film, thus forming the active layer 104. Then, channel doping is performed.

Optionally, prior to forming the a-Si film, the buffer layer 102 is formed on the substrate 100. The buffer layer 102 is made form one of silicon oxide, silicon nitride, silicon oxynitride, or a combination thereof. The buffer layer 102 has a single layer structure or a multiple layer structure. For example, in case the buffer layer 102 is made from silicon oxide, it has a thickness about 50-100 nm. In case the buffer layer 102 is made from silicon nitride, it has a thickness about 100-300 nm. As a result of the above steps, the structure shown in FIG. 7A is obtained.

Then, graphene oxide is prepared. Graphene is prepared in the following manner. Natural flakes of graphite are used as a raw material. Potassium permanganate and concentrated sulfuric acid are used as the oxidizing agent. The raw material of graphite is put into the oxidizing agent for an oxidizing reaction. The duration of reaction is about 1.5 hr (hour), and graphene oxide is obtained. As used herein, the term "concentrated sulfuric acid" indicates an aqueous solution of $H_2SO_4$ with a concentration larger than 70%, and the concentration is defined as the weight percentage of $H_2SO_4$ in the aqueous solution of $H_2SO_4$.

The resulting graphene oxide is cleaned with water to a neutral state. An ethanol aqueous solution with a volume percentage of 10% is used as the solvent, graphene oxide is dispersed by ultrasonic wave, and the graphene oxide dispersion is obtained. For example, graphene oxide dispersion is uniformly applied onto the active layer 104 by spin coating. Then, the graphene oxide dispersion is bake to form the graphene oxide layer 106. By adjusting the concentration of the dispersion, the thickness of the graphene oxide layer 106 is controlled to about 10 nm. Optionally, after baking, the graphene oxide layer 106 is subject to chemical mechanical polishing to increase the surface evenness. As a result of the above steps, the structure shown in FIG. 7B is obtained.

Then, the patterned active layer 104 and graphene oxide layer 106 is formed by a first patterning process. In the context of the present disclosure, the patterning process comprises processes like photoresist coating, masking, exposing, developing, and etching. In particular, photoresist is coated on the structure shown in FIG. 7B, and masking, exposing and developing are performed to form a patterned photoresist layer 151, as shown in FIG. 7C. Then, by taking the photoresist layer 151 as a mask, the active layer 104 and the graphene oxide layer 106 are etched, and the photoresist layer 151 is peeled off to form a stack of the patterned the active layer 104 and graphene oxide layer 106, as shown in FIG. 7D.

Then, the gate insulating layer 108 is deposited by PECVD. The gate insulating layer 108 covers the stack of the active layer 104 and the graphene oxide layer 106 as well as the buffer layer 102, as shown in FIG. 7E.

Figure 7F:
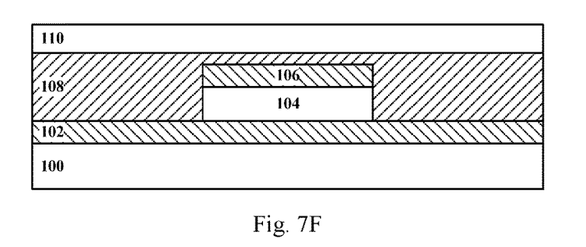

Then, the gate metal layer 110 is deposited on the gate insulating layer 108 by sputtering, as shown in FIG. 7F.

Figure 7G:
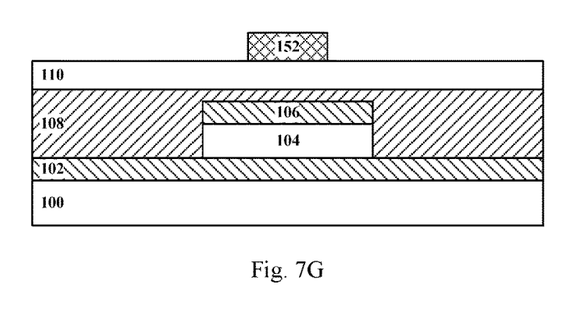
Figure 7H:
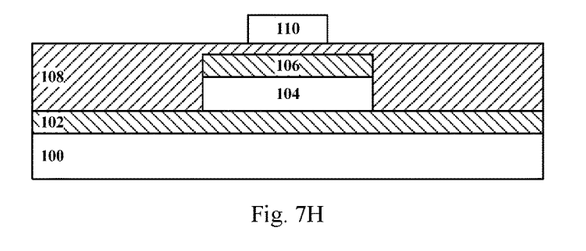

Then, the gate 110 is formed by a second patterning process. In particular, photoresist is coated the structure shown in FIG. 7F, and masking, exposing and developing are performed to form a patterned photoresist layer 152, as shown in FIG. 7G. Then, by taking the photoresist layer 152 as a mask, the gate metal layer 110 is etched, and the photoresist layer 152 is peeled off to form the gate 110, as shown in FIG. 7H.

Figure 7I:
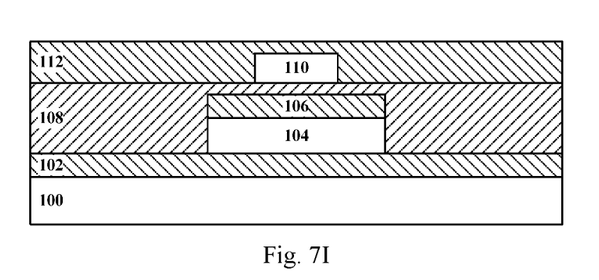

Then, the interlayer dielectric layer 112 is deposited by PECVD, as shown in FIG. 7I.

Figure 7J:
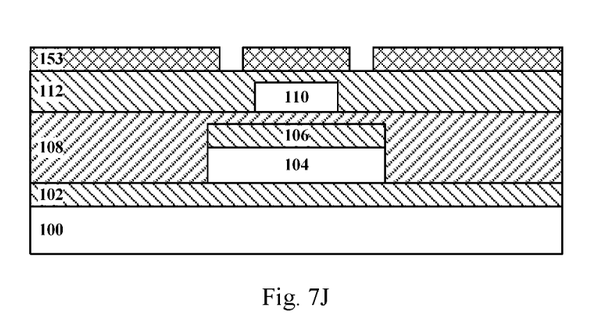

After depositing the interlayer dielectric layer 112, vias for the source and drain are formed by a third patterning process. In particular, photoresist is coated on the structure shown in FIG. 7I, and masking, exposing and developing are performed to form a patterned photoresist layer 153, as shown in FIG. 7J. Then, by taking the photoresist layer 153 as a mask, the interlayer dielectric layer 112 is etched, and vias 114 which run through the graphene oxide layer 106, the gate insulating layer 108 and the interlayer dielectric layer 112 are formed. Then, the photoresist layer 153 is peeled off, and the structure shown in FIG. 7K is obtained.

Figure 7K:
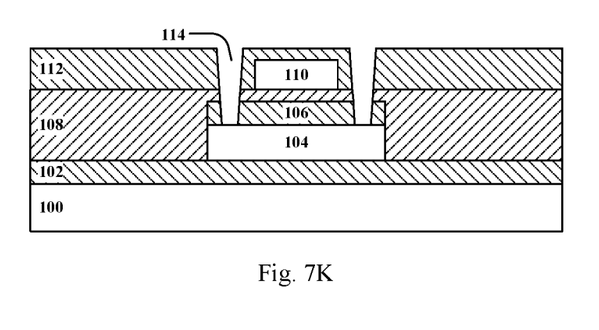
Figure 7L:
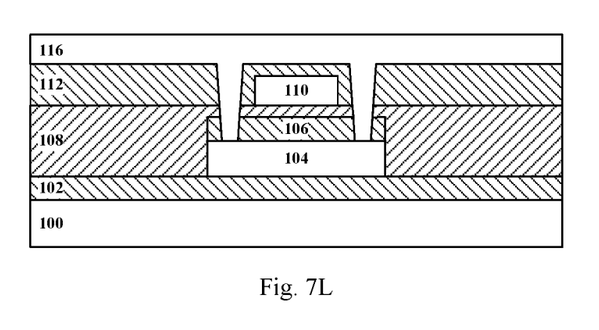

Then, a source/drain metal layer 116 is deposited on the structure shown in FIG. 7K by sputtering. The source/drain metal layer 116 not only covers the interlayer dielectric layer 112, but also fills the vias for the source and drain which are formed in the previous step, as shown in FIG. 7L.

Figure 7M:
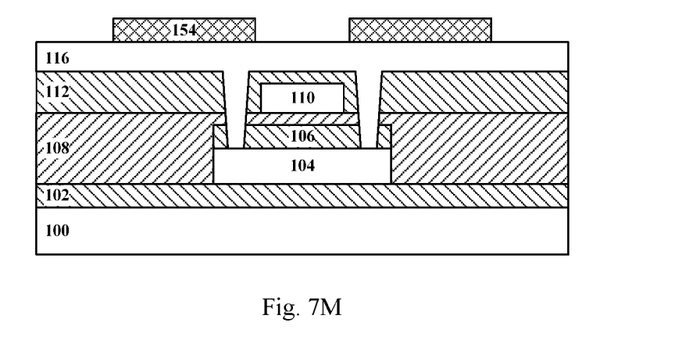
Figure 7N:
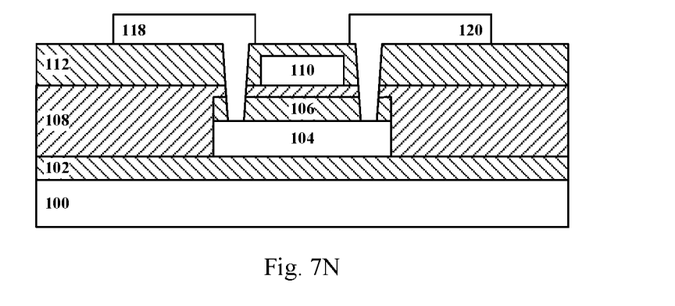

Then, the source 118 and the drain 120 are formed by a fourth patterning process. In particular, photoresist is coated on the structure shown in FIG. 7L, and masking, exposing and developing are performed to form a patterned photoresist layer 154, as shown in FIG. 7M. Then, by taking the photoresist layer 154 as a mask, the source/drain metal layer 116 is etched, and the photoresist layer 154 is peeled off to form the source 118 and the drain 120, as shown in FIG. 7N.

The subsequent process steps are identical with those for a conventional LTPS TFT, and are not described herein in detail. Similarly, as for the bottom gate type TFT shown in FIG. 3, after forming the gate insulating layer 206, the graphene oxide layer and the active layer are formed by film forming processes, respectively, and the stack of patterned graphene oxide layer and active layer is formed by a patterning process. Reference can be made to the process shown in FIGS. 7A-7N for the remaining process steps, and thus the remaining process steps are not described herein in detail.

In the LTPS TFT of the present disclosure, a graphene oxide layer is added between the P-Si active layer and the gate insulating layer. As a result, the roughness and interfacial defect density of the interface between the P-Si active layer and the gate insulating layer is further reduced, and this increases the characteristics of LTPS TFT. Besides, the gate insulating layer pre-cleaning process is not required during the process for fabricating the LTPS TFT, and this simplifies the fabricating process and reduces cost.

Apparently, the person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations. For example, the structure of the LTPS TFT in the present disclosure is not limited to the top gate structure shown in FIGS. 1-2 and the bottom gate structure shown in FIG. 3, as long as a graphene oxide layer is arranged between the gate insulating layer and the active layer. In short, the protection scope of the present disclosure is defined by the appended claims.

What is claimed is:

1. An LTPS TFT comprising: an active layer, a source, a drain, a gate, and a gate insulating layer on a substrate, wherein the gate insulating layer is arranged between the active layer and the gate and wherein the LTPS TFT further comprises a graphene oxide layer which is arranged between the active layer and the gate insulating layer,
wherein an orthographic projection of the graphene oxide layer on the substrate substantially coincides with that of the active layer on the substrate.

2. The LTPS TFT of claim 1, wherein the active layer is arranged on the substrate, the graphene oxide layer is arranged on the active layer, and the gate insulating layer covers a stack of the active layer and the graphene oxide layer.

3. The LTPS TFT of claim 1, wherein the gate is arranged on the substrate, the gate insulating layer covers the gate, the graphene oxide layer is arranged on the gate insulating layer, and the active layer is arranged on the graphene oxide layer.

4. An LTPS TFT comprising: an active layer, a source, a drain, a gate, and a gate insulating layer on a substrate, wherein the gate insulating layer is arranged between the active layer and the gate and wherein the LTPS TFT further comprises a graphene oxide layer which is arranged between the active layer and the gate insulating layer, wherein the graphene oxide layer has a thickness about 10-20 nm.

5. The LTPS TFT of claim 1, wherein the LTPS TFT further comprises a buffer layer which is formed on the substrate.

6. The LTPS TFT of claim 5, wherein the buffer layer is made from silicon oxide, silicon nitride, or silicon oxynitride.

7. The LTPS TFT of claim 5, wherein the buffer layer is made from silicon oxide and has a thickness about 50-100 nm.

8. The LTPS TFT of claim 5, wherein the buffer layer is made from silicon nitride and has a thickness about 100-300 nm.

9. The LTPS TFT of claim 2, further comprising an interlayer dielectric layer which covers the gate, wherein the source and the drain are connected to the active layer through vias which run through the graphene oxide layer, the gate insulating layer and the interlayer dielectric layer, respectively.

10. The LTPS TFT of claim 3, further comprising an interlayer dielectric layer which covers a stack of the active layer and the graphene oxide layer, wherein the source and the drain are connected to the active layer through vias which run through the interlayer dielectric layer, respectively.

11. The LTPS TFT of claim 1, wherein the active layer comprises a source contact area and a drain contact area which are doped; the source is arranged on the source contact area and connected to the source contact area; and the drain is arranged on the drain contact area and connected to the drain contact area.

12. An array substrate, comprising the LTPS TFT of claim 1, a planarization layer covering the LTPS TFT, and a pixel electrode, wherein the pixel electrode is connected to the drain of the LTPS TFT through a via which runs through the planarization layer.

13. A display panel, comprising the array substrate of claim 12.

14. A display device, comprising the display panel of claim 13.

* * * * *